(12) United States Patent
Zhong et al.

(10) Patent No.: US 6,553,170 B2
(45) Date of Patent: Apr. 22, 2003

(54) METHOD AND SYSTEM FOR A COMBINATION OF HIGH BORON AND LOW BORON BPSG TOP CLAD FABRICATION PROCESS FOR A PLANAR LIGHTWAVE CIRCUIT

(75) Inventors: Fan Zhong, Fremont, CA (US); Kangjie Li, Fremont, CA (US)

(73) Assignee: Lightwave Microsystems Corporation, San Jose, CA (US)

( * ) Notice: Subject to any disclaimer, the term of this patent is extended or adjusted under 35 U.S.C. 154(b) by 0 days.

(21) Appl. No.: 09/945,300

(22) Filed: Aug. 31, 2001

(65) Prior Publication Data

US 2003/0044151 A1 Mar. 6, 2003

(51) Int. Cl.⁷ ................................................. G02B 6/10
(52) U.S. Cl. .................... 385/130; 385/129; 385/131; 385/132; 385/144; 385/14; 65/386
(58) Field of Search .......................... 385/129, 130, 385/131, 144, 12, 14; 252/389.4; 427/163.2; 65/443, 444, 445, 446, 386

(56) References Cited

U.S. PATENT DOCUMENTS

| | | |
|---|---|---|
| 3,934,061 A | 1/1976 | Keck et al. ................. 427/165 |
| 4,820,655 A | 4/1989 | Noda et al. ................. 437/129 |
| 5,206,925 A | 4/1993 | Nakazawa et al. ........... 385/142 |
| 5,253,319 A | 10/1993 | Bhagavatula ................ 385/129 |
| 5,295,205 A | 3/1994 | Miller et al. ................ 385/1 |
| 5,324,678 A | 6/1994 | Kusunoki .................... 437/51 |
| 5,408,569 A | 4/1995 | Nishimoto ................... 385/132 |
| 5,637,187 A | 6/1997 | Takasu et al. ................ 438/30 |
| 5,678,935 A | 10/1997 | Sakata ........................ 385/131 |
| 5,703,978 A | 12/1997 | Digiovanni et al. .......... 385/37 |
| 5,719,973 A | 2/1998 | Monroe et al. .............. 385/34 |
| 5,732,179 A | 3/1998 | Caneau et al. .............. 385/131 |
| 5,783,468 A | 7/1998 | Zhang et al. ................ 438/166 |
| 5,885,881 A | 3/1999 | Ojha .......................... 438/381 |
| 5,904,491 A | 5/1999 | Ojha et al. .................. 438/31 |
| 5,982,973 A | 11/1999 | Yan et al. ................... 385/141 |
| 6,044,192 A * | 3/2000 | Grant et al. ................. 385/129 |
| 6,122,429 A | 9/2000 | Wessels et al. ............. 385/130 |
| 6,177,290 B1 | 1/2001 | Jang et al. .................. 438/31 |
| 6,201,918 B1 | 3/2001 | Berkey et al. .............. 385/128 |
| 6,208,792 B1 | 3/2001 | Hwang et al. .............. 385/129 |
| 6,303,393 B1 | 10/2001 | Wessels et al. ............. 438/3 |
| 6,317,444 B1 | 11/2001 | Chakrabarti et al. ......... 372/45 |

\* cited by examiner

*Primary Examiner*—Cassandra Spyrou
*Assistant Examiner*—Denise A. Allen
(74) *Attorney, Agent, or Firm*—Wagner, Murabito & Hao LLP

(57) ABSTRACT

A method of depositing a dual layer top clad for an optical waveguide of a planar lightwave circuit (PLC). The method includes a first step of providing a high flow rate of a Boron dopant gas for a first top cladding layer deposition process. Then, a low flow rate of a Boron dopant gas is provided for a second top cladding layer deposition process. The second top cladding layer deposition process is performed directly on the first top cladding layer deposition. The first and second top cladding layer deposition processes are combined to form a dual layer top clad of the PLC having a high Boron portion covering a plurality of optical cores and a low Boron portion covering the first portion. The first top cladding layer deposition process can comprises three deposition and anneal cycles using the high flow rate for the Boron dopant gas. The three deposition and anneal cycles are used to fill gaps between the plurality of optical cores of the PLC. The second top cladding layer deposition process comprises a single deposition and anneal cycle using the low flow rate for the Boron dopant gas. The low Boron portion is configured to cover the high Boron portion and protect the high Boron portion from corrosion. The Boron dopant gas can comprise $B_2H_6$ or $B(OCH_3)_3$ tetramethyl borate (TMB). Thus the dual layer top clad process can effectively fill high aspect ratio gaps between waveguide cores while maintaining good corrosion resistance.

17 Claims, 5 Drawing Sheets

A TOP VIEW OF TWO INPUT CHANNELS OF AWG MADE BY DUAL LAYER TOP CLAD PROCESS WITH HIGH BORON CONCENTRATION OF 7.0 WT% AND LOW BORON CONCENTRATION OF 5.5 WT%

A TOP VIEW OF TWO INPUT CHANNELS OF AWG MADE BY DUAL LAYER TOP CLAD PROCESS WITH HIGH BORON CONCENTRATION OF 8.5 WT% AND LOW BORON CONCENTRATION OF 5.5 WT%

US 6,553,170 B2

METHOD AND SYSTEM FOR A COMBINATION OF HIGH BORON AND LOW BORON BPSG TOP CLAD FABRICATION PROCESS FOR A PLANAR LIGHTWAVE CIRCUIT

FIELD OF THE INVENTION

The present invention relates generally to the fabrication of planar lightwave circuits. More particularly, the present invention relates to a method and system for fabricating a top clad for a planar lightwave circuit.

BACKGROUND OF THE INVENTION

Planar lightwave circuits (PLCs) comprise fundamental building blocks for the modern fiberoptic communications infrastructure. Planar lightwave circuits are generally devices configured to transmit light in a manner analogous to the transmission of electrical currents in printed circuit boards and integrated circuit devices. Examples include arrayed waveguide grating devices, integrated wavelength multiplexers/demultiplexers, optical switches, optical modulators, wavelength-independent optical couplers, and the like.

PLCs generally involve the provisioning of a series of embedded optical waveguides upon a semiconductor substrate, with the optical waveguides fabricated from a silica glass. PLCs are constructed using the advanced tools and technologies developed by the semiconductor industry. Modern semiconductor electronics fabrication technology can aggressively address the increasing need for integration is currently being used to make PLCs. By using manufacturing techniques closely related to those employed for silicon integrated circuits, a variety of optical elements can be placed and interconnected on the surface of a silicon wafer or similar substrate. This technology has only recently emerged and is advancing rapidly with leverage from the more mature tools of the semiconductor-processing industry.

PLCs are constructed with a number of waveguides precisely fabricated and laid out across a silicon wafer. A conventional optical waveguide comprises an un-doped silica bottom clad layer, with at least one waveguide core formed thereon, and a cladding layer covering the waveguide core, wherein a certain amount of at least one dopant is added to both the waveguide core and the cladding layer so that the refractive index of the waveguide core is higher than that of the cladding layer. Fabrication of conventional optical waveguides involves the formation of an un-doped silica layer as the bottom clad (BC), usually grown by thermal oxidation upon a silicon semiconductor wafer. The core layer is a doped silica layer, which is deposited by either plasma-enhanced chemical vapor deposition (PECVD) or flame hydrolysis deposition (FHD). An annealing procedure then is applied to this core layer (heated above 1000C) not only to expel the undesired chemical substance such as the radicals with bonded hydrogen but also to reduce the inhomogenities of refractive index within the core layer. The waveguide pattern is defined by photolithography on the core layer, and reactive ion etch (RIE) is used to remove the excess doped silica to form waveguide core. A SiO2 cladding layer is then formed through a subsequent deposition process. Finally, the wafer is cut into multiple PLC dies and packaged according to their particular applications.

Prior art FIG. 1 shows a cross-section view of a conventional planar optical waveguide. As depicted in FIG. 1, the planar optical waveguide includes three doped $SiO_2$ glass cores 10a–10c formed over a $SiO_2$ silica bottom clad 12. A BPSG top cladding layer 11 covers both the cores 10a–c and the bottom clad 12. As described above, the refractive index of the cores 10a–c is higher than that of the top cladding layer 11 and the bottom clad 12. Consequently, optical signals are confined axially within cores 10a–c and propagate lengthwise through cores 10a–c. The cores 10a–c are typically doped with Germanium to increase their index of refraction.

Prior art FIGS. 2A through 2C depict a top clad deposition process wherein three waveguide cores 21–23 are covered during a deposition process to form the top clad (e.g., top cladding layer 11). A well known problem with the fabrication of complex PLC devices is the gap fill of high aspect ratio areas between optical waveguide cores during top clad deposition. FIG. 2A shows three cores 21–23 out of the numerous waveguide cores comprising, for example, a 16 channel arrayed waveguide grating device. FIG. 2B shows three waveguides 21–23 at an intermediate step of the top clad deposition process. As shown in FIG. 2B, the gaps between cores 21–23 have been partially filled by the top clad layer 25. Subsequently, as shown in FIG. 2C, when the top clad deposition process is complete, the gaps between cores 21–23 are completely filled and the top clad layer 26 is completely flat and without voids.

Prior art FIG. 3 shows the problems which occur during a top clad deposition process of a highly integrated PLC device. FIG. 3 shows three cores 31–33 which are more closely spaced with respect to waveguides 21–23 of FIG. 2. As is well known, the closely spaced cores 33–31 present high aspect ratio gaps between them which must be filled during the top clad deposition and anneal process. The high aspect ratio of the gaps causes micro voids 41 and 42 to form as top clad layer 37 is deposited. The voids 41–42 are serious defects which significantly affect the performance of the waveguides comprising cores 31–33. In a case where the defects are not so significant as voids, there may be low density areas within the gaps instead of voids. Crystallization, which also adversely affects the performance of the waveguides, will develop in these low density areas.

One solution to this problem is to utilize a very gradual top clad "buildup" process, wherein a number of deposition and anneal cycles are used to gradually buildup the thickness of the top clad layer. Successive thin top clad layers (e.g., typically 6 to 7 layers at minimum) are deposited and annealed in an attempt to avoid the formation of voids. While this solution is somewhat effective in filling high aspect ratio gaps, the large number of deposition and anneal cycles greatly decreases the throughput of the fabrication line.

Another solution to this problem is to use a high flow rate of a Boron dopant gas during the top clad buildup process, wherein the top clad is fabricated with a higher than normal weight percentage of Boron (e.g., greater than 6 wt %). The higher concentration of Boron dopant promotes better reflow characteristics of the top clad layer during the anneal process, thereby providing better gap filling capability. The better gap filling capability of a high Boron top clad process more effectively fills the gap between two closely spaced cores having a higher aspect ratio. The drawback to this solution however, is the fact that a high Boron top clad is much more susceptible to corrosion problems. High Boron concentrations within the silica matrix leads to a much higher corrosion susceptibility compare to the low Boron concentration silica glass. The corrosion can cause significant reliability problems for the PLC device, for example, insertion loss can become worse after prolonged exposure to high temperature and high humidity environment conditions.

Thus what is needed is a solution that can effectively fill high aspect ratio gaps between waveguide cores of an arrayed waveguide grating PLC device. What is needed is a solution that promotes better reflow characteristics during the anneal process and better gap filling capability while still maintaining good corrosion resistance. What is needed is a solution that can fill high aspect ratio gaps without adding an excessive amount of time to the overall device fabrication process. The present invention provides a novel solution to the above requirements.

SUMMARY OF THE INVENTION

The present invention is a method and system for a combination of high Boron and low Boron top clad fabrication process for a planer lightwave circuit. The present invention provides a solution that can effectively fill high aspect ratio gaps between waveguide cores of a PLC device. The present invention provides a solution that promotes better reflow characteristics during the anneal process and better gap filling capability without causing higher corrosion rates. The present invention provides solution that can fill high aspect ratio gaps without adding an excessive amount of time to the overall device fabrication process.

In one embodiment, the present invention is implemented as a dual layer top clad fabrication method for a PLC. The method includes a first step of providing a high flow rate of a Boron dopant gas for the first top cladding layer deposition process. Then, a low flow rate of a Boron dopant gas is provided for the second top cladding layer deposition process. The second top cladding layer deposition process is performed directly on the first top cladding layer deposition. The first and second top cladding layer are combined to form a dual layer top clad of the PLC having a high Boron portion covering a plurality of optical cores and a low Boron portion covering the high Boron portion.

The first top cladding layer deposition process can comprise three deposition and anneal cycles using the high flow rate of the Boron dopant gas. The three deposition and anneal cycles are used to fill gaps between the plurality of optical cores of the PLC. The second top cladding layer deposition process comprises a single deposition and anneal cycle using the low flow rate of the Boron dopant gas. The low Boron portion is configured to cover the high Boron portion and protect the high Boron portion from corrosion. The Boron dopant gas can comprise $B_2H_6$ or $B(OCH_3)_3$ tetramethyl borate (TMB).

Thus the dual layer top clad process can effectively fill high aspect ratio gaps between waveguide cores with better corrosion resistance. The high Boron concentration in the first portion of the top clad promotes better reflow characteristics during the anneal process and better gap filling capability. The better gap filling capability reduces the number of deposition and anneal cycles needed to fill the high aspect ratio gaps. The low Boron concentration in the second portion of the top clad protects the PLC from corrosion.

BRIEF DESCRIPTION OF THE DRAWINGS

The present invention is illustrated by way of example and not by way of limitation, in the Figures of the accompanying drawings and in which like reference numerals refer to similar elements and in which.

Prior art

Prior art

Prior art

Prior art

Prior art

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Embodiments of the present invention are directed towards a method for a combination of high Boron and low Boron top clad fabrication process for a PLC. The present invention provides a solution that can effectively fill high aspect ratio gaps of a PLC device by promoting better reflow characteristics during the anneal process, and with better corrosion resistance. The present invention provides solution that can fill high aspect ratio gaps without adding an excessive amount of time to the overall device fabrication process. The present invention and its benefits are further described below.

Figure 1:
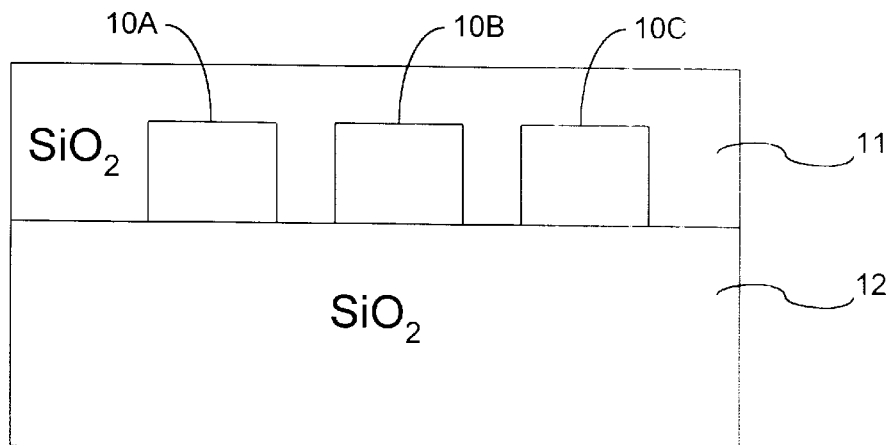
FIG. 1 shows a cross-section view of a conventional planar optical waveguide fabricated using a silica glass substrate.
Figure 2A:
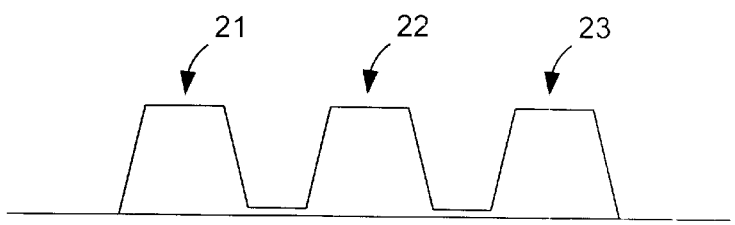
FIG. 2A shows three cores of three optical waveguides of a typical arrayed waveguide grating device before top clad deposition.
Figure 2B:
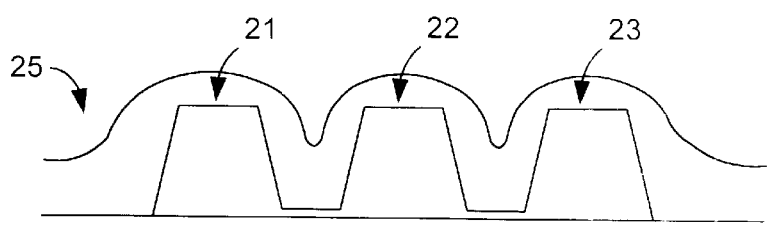
FIG. 2B shows three waveguide cores of three waveguides of a typical arrayed waveguide grating device after few steps of a top clad deposition and anneal process.
Figure 2C:
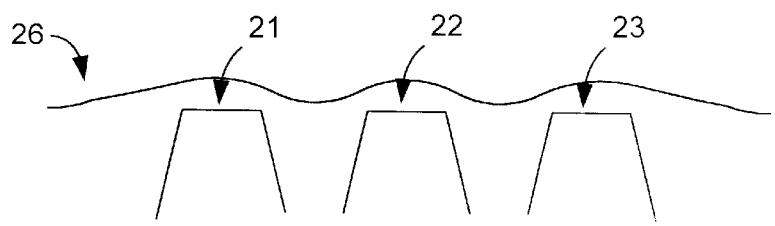
FIG. 2C shows three waveguide cores of three waveguides of a typical arrayed waveguide grating device at the completion of the top clad deposition and anneal processes.
Figure 3:
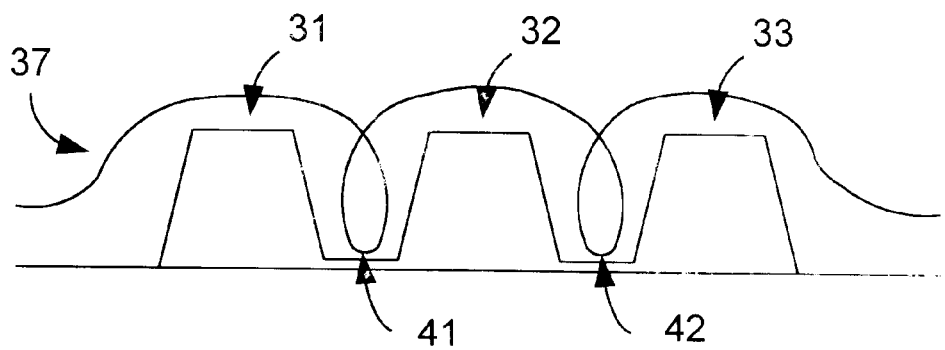
FIG. 3 shows three waveguide cores which are more closely spaced with respect to waveguides cores of FIG. 2C.
Figure 4:
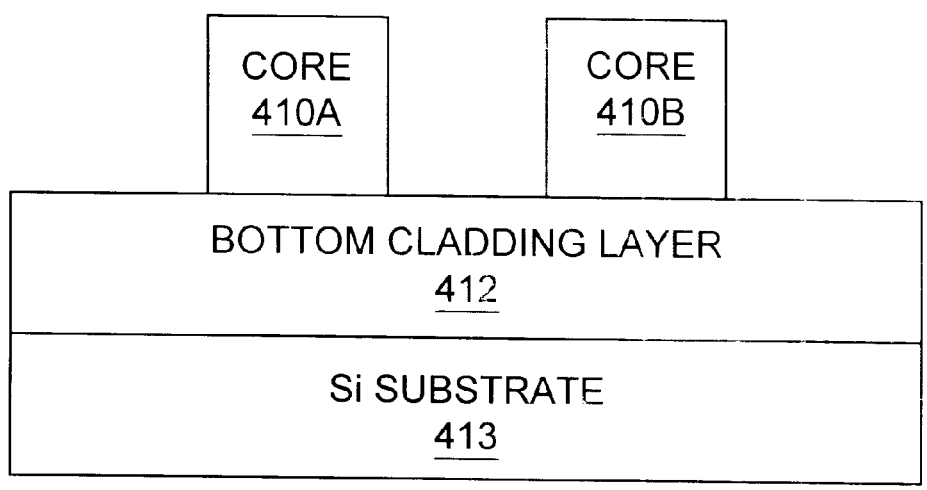
FIG. 4 shows a cross-section view of an optical waveguide structure prior to a dual layer top clad deposition process of the present invention.

FIG. 4 shows a cross-section view of an optical waveguide structure 400 in accordance with one embodiment of the present invention. As depicted in FIG. 4, optical waveguide structure 400 is shown in a state subsequent to etching to remove a core layer used to form cores 410*a* and 410*b*. Cores 410*a–b* comprise doped $SiO_2$ glass cores formed over a $SiO_2$ bottom cladding layer 412 which is on a silicon substrate 413.

As depicted in FIG. 4, cores 410*a–b* are disposed close together on bottom cladding layer 412, thereby forming a gap between them (e.g., typically aspect ratio 2–3). It is critical that the gap be effectively filled during the subsequent top cladding layer deposition and anneal processes. As used herein, the term aspect ratio refers to the height of the cores 410*a–b* divided by the width of the gap between them. For example, in a case where the cores 410*a–b* are 6 microns high (e.g., from the top of the cores to bottom clad) and the gap is 2 microns wide, the aspect ratio is 3.

Many different types of PLC devices are highly dependent upon the precise fabrication of closely spaced waveguide cores such as cores 410*a–b*. The gap between cores 410*a–b* needs to be uniformly filled by top cladding layer material without voids or seams, or crystallization defects. The present invention uses a dual layer top clad process to build a top clad.

Figure 5A:
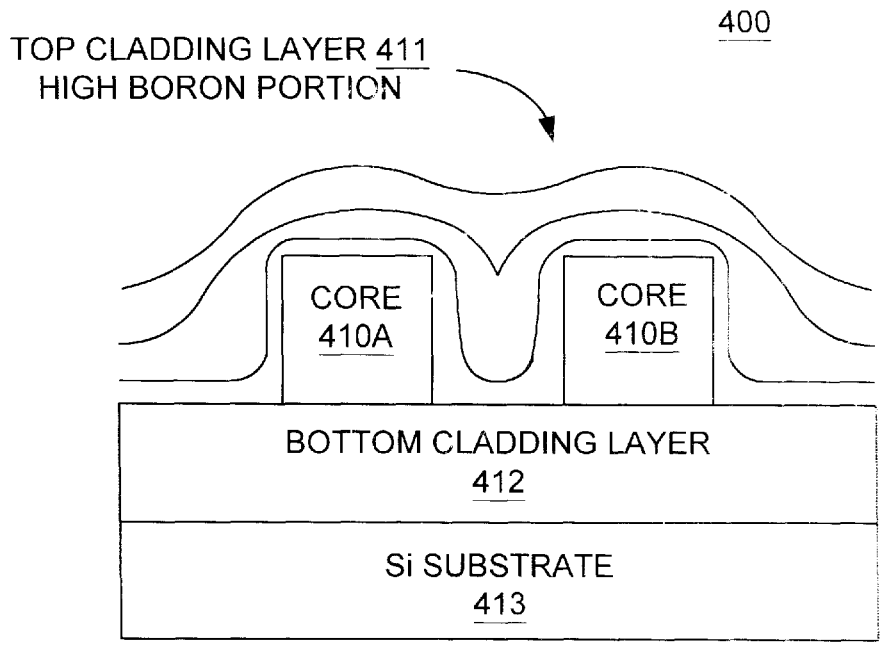
FIG. 5A shows a cross-section view of the optical waveguide structure after deposition and anneal of a high Boron portion of a top cladding layer in accordance with the present invention.

FIG. 5A shows a cross-section view of the optical waveguide structure 400 after deposition and anneal of a high Boron portion of a top cladding layer 411*a* in accordance with the present invention. As depicted in FIG. 5, a high Boron portion top cladding layer 411*a* has been deposited across cores 410*a–b* and bottom cladding layer 412.

In this embodiment, a dual layer top clad fabrication process is used to make a high Boron portion and a low Boron portion of the top cladding layer. The high Boron portion 411*a* is shown in FIG. 5A. The high Boron portion 411*a* is deposited by three deposition and anneal steps. This is shown as the three layers comprising the high Boron portion 411*a*. During the deposition of each of the first three layers, a high flow rate of a Boron dopant gas is provided to yields a high weight percentage of Boron (greater than 6%) in these first three layers. The high Boron concentration causes the first three layers to have a better reflow characteristics, thus allowing them to more effectively fill the gap between cores 410*a–b*.

The better reflow characteristics of these first three layers of portion 411*a* shown in FIG. 5 allows the gap between cores 410*a–b* to be mostly filled with only three deposition/anneal cycles. This is much better than the prior art gap fill processes, which typically require 6 or more deposition/anneal cycles. Thus using high Boron concentrations the first three layers saves a significant amount of time in the overall device fabrication process.

The use of high Boron in top cladding layer portion 411*a* also reduces stress within cores 410*a–b*. The use of higher concentrations of Boron causes the coefficient of thermal expansion (CTE) of portion 411*a* to more closely match the CTE of the Si substrate 413. Matching CTE reduces the stress induced refractive index birefringence in cores 410*a–b*, thus reducing polarization dependent wavelength shift (PDW) and polarization dependent loss (PDL).

An additional benefit is the fact that the high Boron concentration BPSG in portion 411*a* reflows at lower temperatures during anneal process. This reduces the thermal impact on cores 410*a–b* as portion 411*a* is annealed after each layer is deposited. The refractive index of cores 410*a–b* is temperature sensitive and tends to change with each subsequent anneal of the top cladding layer. Thus, by lowering the temperatures used for anneal and by reducing the overall number of deposition/anneal cycles required, refractive index control of cores 410*a–b* is improved.

The high Boron concentration in portion 411*a* also improves refractive index control of the overall top cladding layer. The dopants used for controlling the refractive index are sensitive to anneal temperature. Thus, by lowering the temperatures used for anneal and by reducing the overall number of deposition/anneal cycles required, refractive index control of the overall top cladding layer is improved.

Figure 5B:
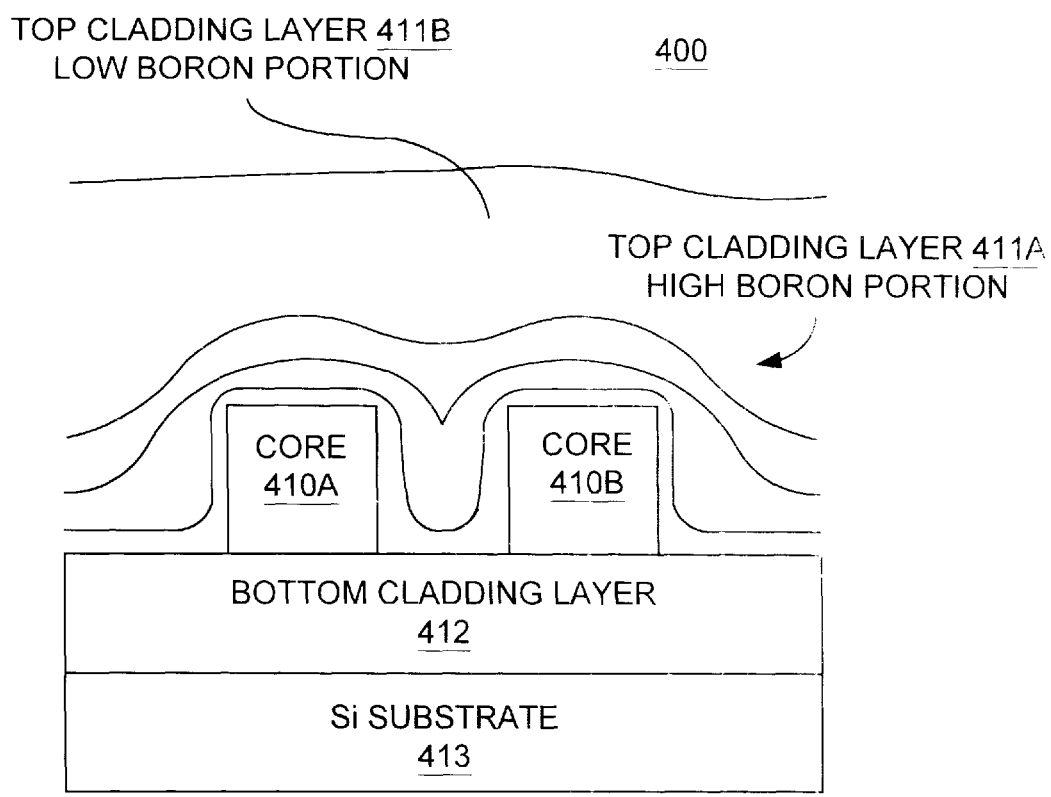
FIG. 5B shows a cross-section view of the optical waveguide structure after deposition and anneal of a low Boron portion of a top cladding layer in accordance with the present invention.

FIG. 5B shows a cross-section view of the optical waveguide structure 400 after deposition and anneal of a low Boron portion of a top cladding layer 411*b* in accordance with the present invention. As depicted in FIG. 5, a high Boron portion top cladding layer 411*a* has been deposited across cores 410*a–b* and bottom cladding layer 412. Then a low Boron portion 411*b* is deposited across the portion 411*a*.

In the present embodiment, after the high Boron portion 411*a* has been deposited and annealed, a low flow rate of a Boron dopant gas is provided for a second top cladding layer deposition process. The second top cladding layer deposition process is performed directly on the first top cladding layer deposition (e.g., the three layers of portion 411*a*). Thus, as shown in FIG. 5B, the first and second top cladding layer deposition processes are combined to form a dual layer top clad of the PLC having a high Boron portion 411*a* covering a cores 410*a–b* and a low Boron portion 411*b* covering the first portion 411*a*.

The weight percentage of Boron in portion 411*b* is preferably below 6%. Boron concentrations below 6% have a much lower susceptibility to corrosion. Thus portion 411*b* protects the high Boron portion 411*a* from exposure to environmental elements (e.g., air, humidity, etc.) which can promote corrosion. Since the layers of portion 411*a* are used to fill the gaps between cores 410*a–b*, a single deposition and anneal cycle can be used to deposit the portion 411*b*. The Boron dopant gas can comprise $B_2H_6$ or $B(OCH_3)_3$ tetramethyl borate (TMB).

Thus the dual layer top clad process can effectively fill high aspect ratio gaps between waveguide cores without causing higher corrosion susceptibility. The high Boron dopant concentration of the first portion promotes better reflow characteristics during the anneal process and better gap filling capability. The better gap filling capability reduces the number of deposition and anneal cycles needed to fill the high aspect ratio gaps. The low Boron dopant concentration of the second portion protects the PLC from corrosion.

The dual layer top clad process of the present invention allows the use of high Boron in a BPSG (borophosphosilica glass) top cladding layer. As described above, the use of higher Boron concentrations reduces PDW and PDL. The low Boron portion 411*b* of the dual layer top clad protects the high Boron portion 411*a* from corrosion.

Figure 6:
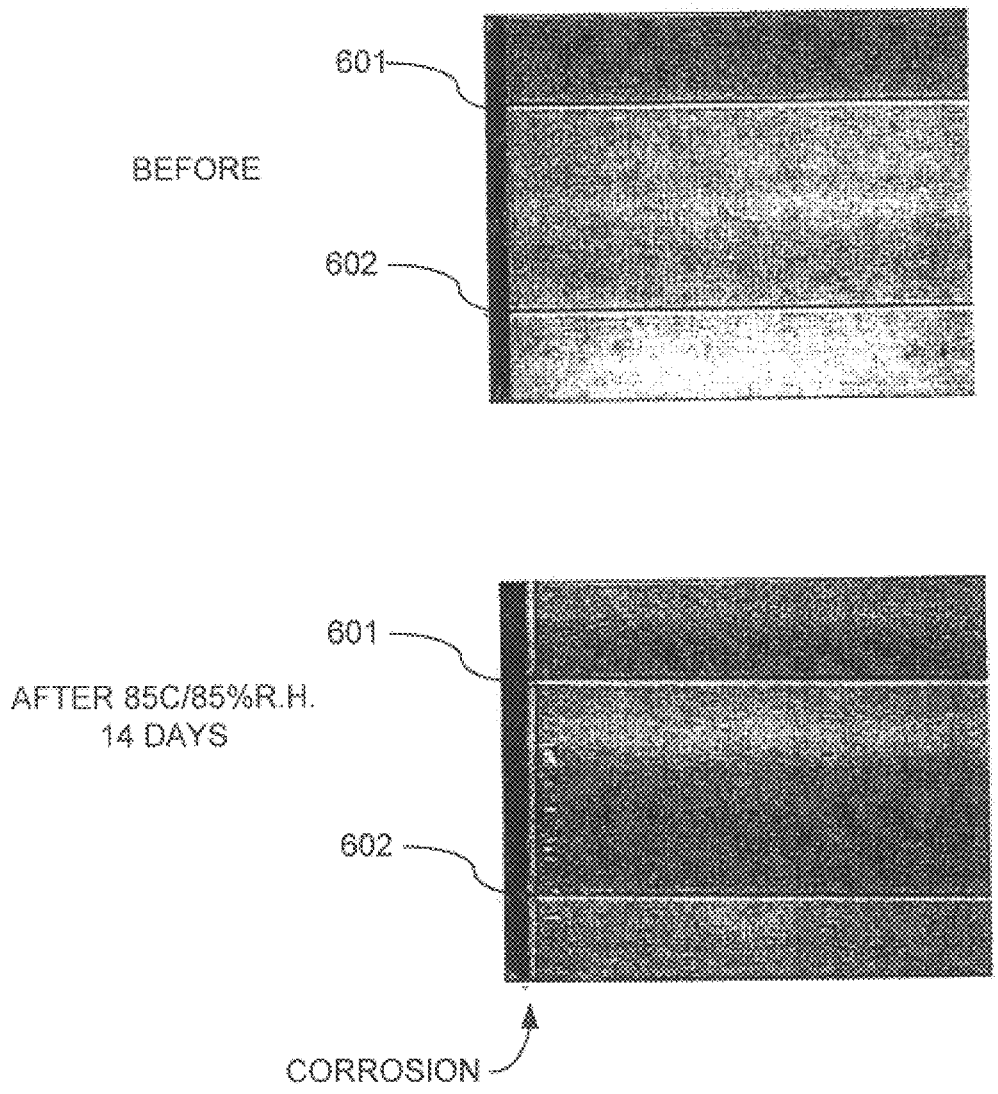
FIG. 6 shows the top view of a PLC fabricated using a dual layer top clad process in accordance with one embodiment of the present invention.
Figure 7:
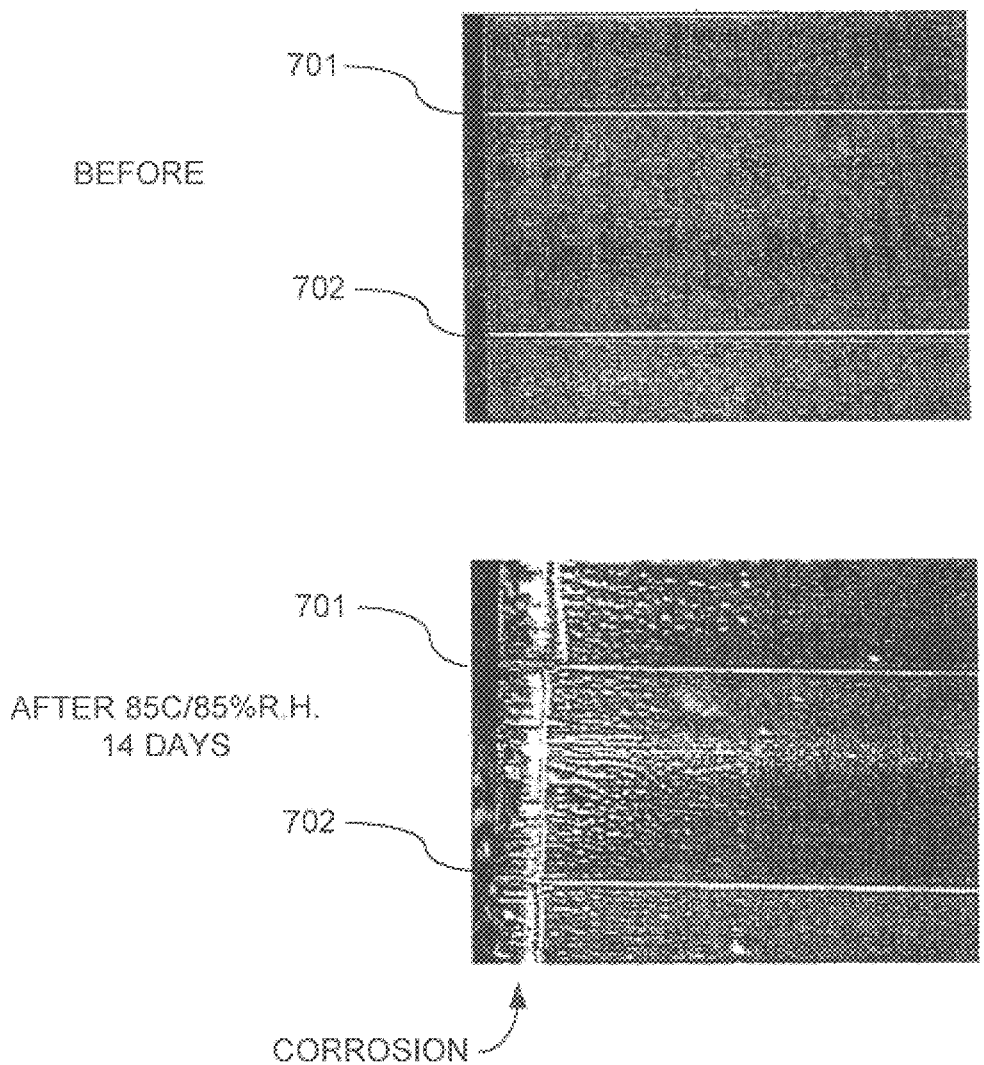
FIG. 7 shows the top view of a PLC fabricated using a dual layer top clad process in accordance with one embodiment of the present invention.

FIGS. 6 and 7 show top views of PLCs fabricated using a dual layer top clad process in accordance with embodiments of the present invention. Referring to FIG. 6, two Arrayed Waveguide Grating (AWG) input channels 601 and 602 diced at the left edge with a dual layer BPSG top clad are shown in two states: before and after high temperature 1 high humidity aging test (i.e. 85C/85% relative humidity for 14 days). The before aging state is shown at the top of FIG. 6 and the after aging state is shown at the bottom. As illustrated in FIG. 6, a high/low Boron concentration of 7 wt %/5.5 wt % for the high Boron portion/low Boron portion of the top clad allows only very small amount of corrosion. This is shown in FIG. 6 as the small white line having grown along the dicing edge of that AWG input channels in the after aging state.

FIG. 7 shows two AWG input channels 701 and 702 diced at left edge with dual layer top clad of high/low Boron concentration of 8.5wt %/5.5wt %. As shown in FIG. 7, the higher Boron concentration causes more corrosion in comparison to FIG. 6.

The effective corrosion length increases from about 3 um to 150 um by increasing Boron concentration from 7.0 wt % to 8.5 wt % in the high Boron portion of the top cladding layer.

There is no degradation on insertion loss of AWG made by dual layer top clad process with 7.0 wt % Boron in the high Boron portion and 5.5 wt % Boron in the low Boron portion in comparison to a conventional top clad process.

Thus as shown in FIGS. 6–7, the ratio between the high/low Boron concentrations can be tuned in accordance with the expected environment of the PLC device. Factors, such as the susceptibility of the PLC device to corrosion related problems, can be taken into account when selecting the high/low Boron ratio.

Embodiments of the present invention are directed towards a method for a combination of high Boron and low Boron top clad fabrication process for a PLC. The present invention provides a solution that can effectively fill high aspect ratio gaps of a PLC device by promoting better reflow characteristics during the anneal process, and with better corrosion resistance. The present invention provides solution that can fill high aspect ratio gaps without adding an excessive amount of time to the overall device fabrication process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, thereby to enable others skilled in the art to best utilize the invention and various embodiments with various modifications as are suited to the particular use contemplated. It is intended that the scope of the invention be defined by the claims appended hereto and their equivalents.

What is claimed is:

1. A method of depositing a top clad layer for an optical waveguide of a planar lightwave circuit (PLC), the method comprising the steps of:
    a) providing a high flow rate of a Boron dopant gas for a first top cladding layer deposition process; and
    b) providing a low flow rate of a Boron dopant gas for a second top cladding layer deposition process, the first top cladding layer and the second top cladding layer combined to form a top cladding layer of the PLC having a high Boron portion covering a plurality of optical cores and a low Boron portion covering the high Boron portion.

2. The method of claim 1 wherein the first top cladding layer deposition process comprises three deposition and anneal cycles using the high flow rate for the Boron dopant gas.

3. The method of claim 2 wherein the three deposition and anneal cycles are used to fill gaps between the plurality of optical cores of the PLC.

4. The method of claim 1 wherein the second top cladding layer deposition process comprises a single deposition and anneal cycle using the low flow rate of the Boron dopant gas.

5. The method of claim 1 wherein the low Boron portion is configured to cover the high Boron portion to protect the high Boron portion from corrosion.

6. The method of claim 1, wherein the Boron dopant gas comprises $B_2H_6$ or $B(OCH_3)_3$ tetramethyl borate (TMB).

7. A method of depositing a dual layer top clad for a planar lightwave circuit (PLC) device, the method comprising the steps of:
    a) providing a high flow rate of a Boron dopant gas for a first top cladding layer deposition process; and
    b) providing a low flow rate of a Boron dopant gas for a second top cladding layer deposition process, the first top cladding layer deposition process and the second top cladding layer deposition process combined to form a top cladding layer of the PLC having a high Boron portion covering a plurality of optical cores and a low Boron portion covering the high Boron portion.

8. The method of claim 7 wherein the first top cladding layer deposition process comprises three deposition and anneal cycles using the high flow rate of the Boron dopant gas.

9. The method of claim 8 wherein the three deposition and anneal cycles are used to fill gaps between the plurality of optical cores of the PLC.

10. The method of claim 7 wherein the second top cladding layer deposition process comprises a single deposition and anneal cycle using the low flow rate of the Boron dopant gas.

11. The method of claim 7 wherein the low Boron portion is configured to cover the high Boron portion to protect the high Boron portion from corrosion.

12. The method of claim 7, wherein the Boron dopant gas comprises $B_2H_6$ or $B(OCH_3)_3$ tetramethyl borate (TMB).

13. The method of claim 8, wherein the high flow rate of the Boron dopant gas during the first top cladding layer deposition process is configured to reduce a number of deposition and anneal cycles required for gap filling.

14. The method of claim 7, wherein the low flow rate of the Boron dopant gas during the second top cladding layer deposition process is configured to reduce chip edge corrosion of the planar lightwave circuit.

15. A dual layer top clad for an optical waveguide of a planar lightwave circuit (PLC) comprising a top clad layer having a high Boron portion covering a plurality of optical cores of the PLC and a low Boron portion covering the high Boron portion protecting the high Boron portion from corrosion.

16. The top clad layer of claim 15 wherein a weight percentage of Boron dopant of the high Boron portion is no more than 7 wt %.

17. The top clad layer of claim 15 wherein a weight percentage of Boron dopant of the low Boron portion is no more than 5.5 wt %.

* * * * *